United States Patent [19]

Im

[11] Patent Number: 5,541,939
[45] Date of Patent: Jul. 30, 1996

[54] ERROR CORRECTION CODE DECODER AND A METHOD THEREOF

[75] Inventor: Jin H. Im, Seoul, Rep. of Korea

[73] Assignee: Goldstar Company, Ltd., Seoul, Rep. of Korea

[21] Appl. No.: 325,021

[22] Filed: Oct. 18, 1994

[30] Foreign Application Priority Data

Oct. 20, 1993 [KR]  Rep. of Korea .................. 21853/1993

[51] Int. Cl.$^6$ .......................... G11C 29/00; H03M 13/00
[52] U.S. Cl. ......................................... 371/40.3; 371/37.4
[58] Field of Search .................................. 371/37.1, 40.1, 371/40.3, 40.4, 37.4

[56] References Cited

U.S. PATENT DOCUMENTS

| | | | |
|---|---|---|---|
| 4,555,784 | 11/1985 | Wood ..................... | 371/37.1 |
| 4,677,622 | 6/1987 | Okamoto et al. ....... | 371/39.1 |
| 4,845,713 | 7/1989 | Zook ...................... | 371/37.1 |
| 5,020,060 | 5/1991 | Murai et al. ............ | 371/37.1 |
| 5,206,864 | 4/1993 | McConnell ............. | 371/37.4 |
| 5,373,511 | 12/1994 | Veksler .................. | 371/37.4 |
| 5,379,305 | 1/1995 | Weng ..................... | 371/41 |

FOREIGN PATENT DOCUMENTS

| | | |
|---|---|---|
| 140381 | 5/1985 | European Pat. Off. . |
| 167627 | 1/1986 | European Pat. Off. . |
| 278383 | 8/1988 | European Pat. Off. . |
| 387924 | 9/1990 | European Pat. Off. . |

OTHER PUBLICATIONS

Shahri et al., On Error–and–Erasure Decoding of Cyclic Codes, Mar. 1992, New York, US, pp. 489–496, vol. 38, No. 2.
Patent Abstracts of Japan, vol. 13, No. 363 (P–918) Aug. 14, 1989 regarding JP-A-01 122081 (Mitsubishi Electric Corp.) May 15, 1989.
Patent Abstracts of Japan, vol. 14, No. 557 (E–1011) Dec. 11, 1990 regarding JP-A-02-239729 (Mitsubishi Electric Corp.) Sep. 21, 1990.

*Primary Examiner*—Paul P. Gordon

[57] ABSTRACT

An error correction decoder that, if the sum of the number of instances of error data and possible error data is in the range of the error correction capacity of the decoder, recognizes all the data as erasures, and if the sum is not in the range of the error correction of the decoder, recognizes only the error data as erasures. Therefore, the error correction decoder classifies the possible error data as erasures not within the range of the error correction capacity of the decoder and effectively decodes by implementing the error correction.

6 Claims, 12 Drawing Sheets

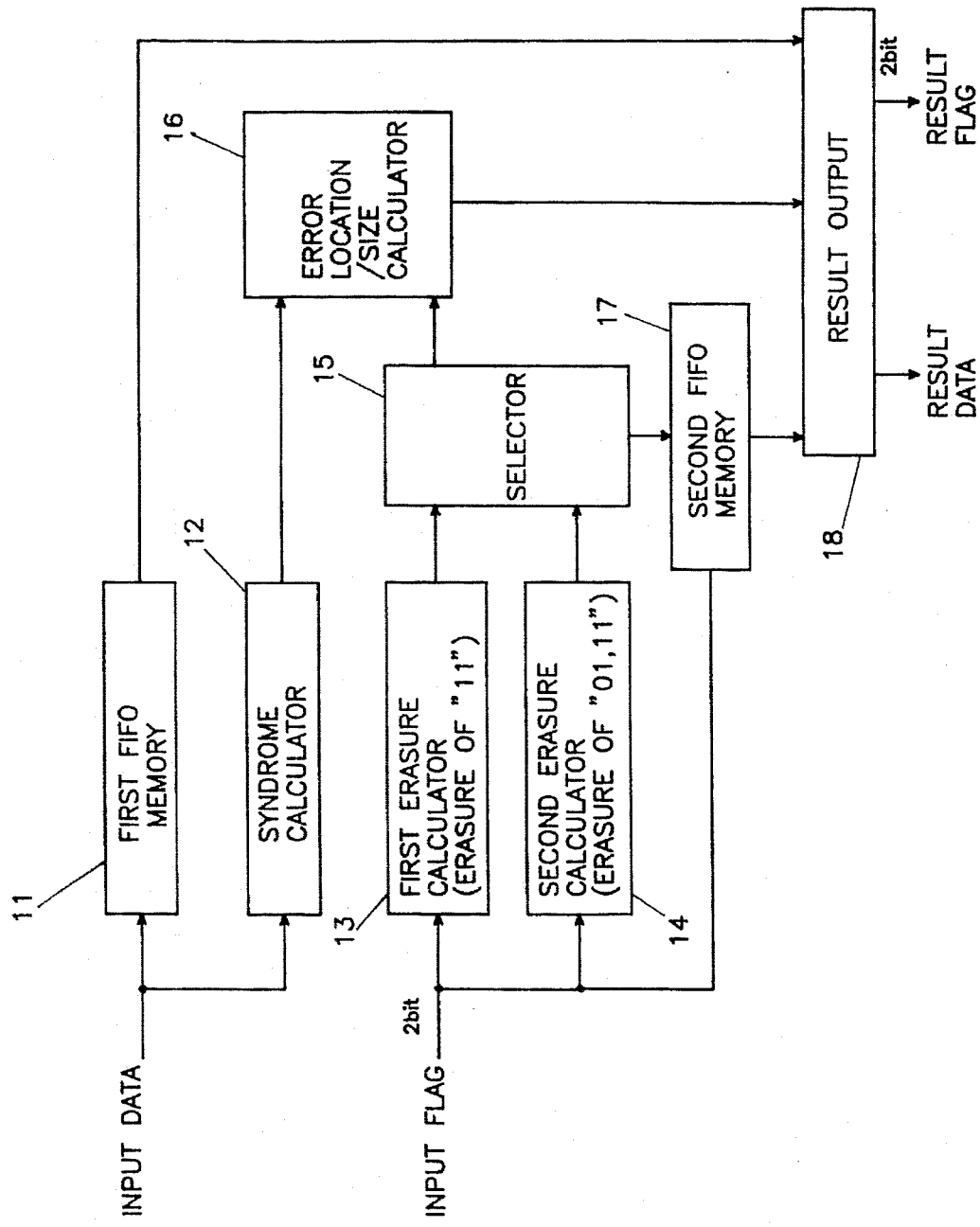

ERROR CORRECTION CODE DECODER AND A METHOD THEREOF

BACKGROUND OF THE INVENTION

1. Field of the Invention

The present invention relates in general to an error correction code decoder and a method thereof, and in particular to an error correction code decoder and a method thereof capable of effectively implementing error correction using a small size decoder with two kinds of erasures in order to maximize features of the product code.

2. Description of the Conventional Art

Conventionally, designing a stable circuit capable of sending, receiving and storing digital data free of errors is extremely costly. Thus, in general, circuits are designed for permitting some data errors and in compensation for this, the original data is encoded/decoded by a predetermined algorithm for detecting or correcting the aforementioned errors. Here, the code in which the original data is encoded is called an error correction code, and since this error correction code is arranged to be in a certain order between each of the symbols which is consisting of codes, the errors which might happen during sending, receiving, storing, or restoring the data are detected or corrected during decoding. In addition, for detecting/correcting more data errors during decoding, the code length of the error correction code becomes longer, and the size of the encoder/decoder which is used becomes larger. Therefore, during the design of the circuit, the error detection/correction capability and the size of the encoder/digital decoder should be considered.

To correct the error during decoding, despite what kind of error correction code is used, the possible error location-(which symbol has the error?) in the received/restored data and the error size(what is The original value need to be obtained?) must be determined. Therefore, for error correction, each data needs two equations since each error has two kinds of information, error location and size.

However, depending on circumstances, there may be cases where at least it is known that the specific symbol of a code is not correct, although the actual value is known. That is, in case that the value of the received/restored data is completely unexpected or if serious noises are mixed therein, the corresponding values will be unreliable. This is also a kind of an error, but since the location thereof is known, for computing the size, only one equation is needed. This is an erasure. Therefore, since the capacity of error correction of the error correction code is decided according to how many equations can be used, in case that the same error correction code is used, if the information of the erasure may be transferred to the decoder, the total sum of the error which can be corrected by the decoder will increase.

In addition, the errors which occur during sending, receiving and storing are classified into two kinds: a sporadic error which occurs with a certain probability and a concatenated error which a couple or a couple of tens of symbols consequently occur in error. The error correction code decoder is strong against sporadic error but weak against concatenated error, so in order to correct concatenated errors, a very large size decoder is needed. For achieving a higher error detection/correction capability with a small size encoder/decoder, conventionally, there had been introduced the concatenated code to encode the original data more than twice using different methods. One method is a product code which is to array the original data and then to encode/decode the arrayed data once in each horizontal and vertical directions.

The product code, as shown in FIG. 1, is designed to be strong for concatenated error by adding the parities Pmk and Qln in a horizontal and vertical direction for the original data Smn, here, Rlk is a parity of C1 code and a parity of C2 code. In FIG. 1, if we assume that the code in a horizontal direction is C1 and the code in a vertical direction is C2, the product code which consists of C1 and C2 is designed in order that the concatenated error in one direction may not be the sporadic error in a different direction, so that with a small size of the decoder, the decoding is effectively implemented.

The conventional decoder, as shown in FIG. 2, includes a first-in, first-out memory 1 for temporally storing the received/restored data; a syndrome calculator 2 for computing a syndrome which is a result value from the received/restored data; an erasure calculator 3 for computing an erasure location equation by counting the number of erasures from the 1 bit flag; an error location/size calculator 4 for computing the error location and size by using the erasure location equation of the erasure calculator 3; and a result output section 5 for outputting the corrected data and the flag after correcting the error mixed into the data inputted from the first-in, first-out memory 1 according to an operation of the output signal of the error location/size calculator 4.

The operative description of the conventional decoder will now be explained with reference to FIG. 3 and FIG. 4.

To begin with, when a received/restored 1 bit flag is inputted into the erasure calculator 3, the erasure calculator 3 detects whether the erasure occurred based upon the inputted flag. Here, if the erasure occurred, it is also determined whether the total number of the occurred erasure is in the range of error correction of the decoder. If the number of the erasure is in the range of the error correction of the decoder, the erasure calculator 3 computes the erasure location and outputs it to the error location/size calculator 4.

Meanwhile, the received/restored data is temporally stored into the first-in, first-out memory 1 and inputted into the syndrome calculator 2. At this time, the syndrome calculator 2 calculates the received/restored data containing mixed errors and outputs a specific result value of the errors, called the syndrome, and outputs the syndrome which is a result value of its inherent error and outputs it to the error location/size calculator 4.

Thereafter, the error location/size calculator 4 calculates the syndrome value and outputs an error location equation. At this time, the error location/size calculator 4 includes the erasure location the erasure calculator 3 into the error location equation. Thereafter, the error location/size calculator 4 computes the error size equation using the aforementioned error location equation and computes the above error location equation and the error size equation if the two computed equation are in the range of the error correction of the decoder, so that the error location/size are outputted therefrom.

The result output section 5 corrects the error of the data inputted from the first-in, first-out memory 1 according to the error location/size computed at the error location/size calculator 4, and applies 1 bit data when the error correction is completed, which implies that the current data is reliable, to each of the data and outputs them. However, in case that the detected errors are judged as not being in the range of the error correction of the decoder by checking the number of the erasure, or the detected error is judged as not being in the range of the error correction of the decoder by checking the error location equation and the error size equation at the error location/size calculator 4, the result output section 5 outputs the output data of the first-in, first-out memory 1 without correction and adds a 1 bit flag, which implies that the current data is not reliable, to each of the data and outputs them.

Whether the data which the result output section 5 outputs is reliable or not is indicated by whether 1 bit is added to each of the data or not. If the flag bit of the inputted data is set as 1, the erasure calculator 3 judges the data as not reliable. In addition, if the error location/size calculator 4 judges that the current data is not reliable, the current data for flag bit is set to as 1. Here, the data which the flag is set 1 indicates an erasure and the data for which the set to flag is set zero indicates normal data. The erasure which occurs as a result of the decoding, is used at the second decoding in the product code.

As these decoding process are repeatedly implemented, the data errors are corrected. If the data shown in FIG. 4A are received/restored, C1 code is decoded as shown in FIG. 4B. Here, since the fourth row shown in FIG. 4B is not in the range of the error correction of the decoder, all are processed as erasures. In addition, when C2 code is decoded, erasures of the fourth row are recognized as individual erasures, and as the decoding is implemented, the errors are corrected sufficiently. As described above, when the product code is decoded in the order "Receiving/restoring→C1 decoding→C2 decoding," the following differences occur between the erasure during the receiving/restoring of the data and the erasure during the decoding of C1 code. That is, the erasure which occurs during the receiving/restoring of the data are the actually occurred errors, however, to process each of the data of the fourth row as shown in FIG. 4B as an erasure implies that all the data of the corresponding code are not correct. If the number of erasures occurred during receiving/restoring data is not in the range of the error correction, the number of the erasure increases as shown in FIG. 4A. If the number of the increased erasures are in the range of the error correction, there are no problems. Otherwise, due to the erasures increased during decoding of C1 code, C2 code might fail to correct the errors of the data. That is, according to the conventional decoder, if the number of the errors increase beyond a predetermined limitation due to the characteristics of the products code, decoding of data will not be implemented despite the fact that data might have been be likely decoded.

SUMMARY OF THE INVENTION

Accordingly, it is an object of the present invention to provide an error correction code decoder and a method for effectively decoding all data as erasure if the sum of error data and possible error data are in a range of error correction of the decoder and decoding only the error data as erasure if the sum of error data and possible data is not in a range of error correction of the decoder.

The object of an error correction code decoder according to the present invention is achieved by a device includes a first first-in, first-out memory for temporally storing received/restored original data; a syndrome calculator for computing a syndrome value obtained via an operation upon the received/restored original data; a first erasure calculator for computing an erasure location equation by counting the number of flags which indicates normal data; a second erasure calculator for computing an erasure location equation and for counting the number of flags which indicate error data or possible error data; a selector for selecting an output signal of the second erasure calculator when the output signal of the second erasure calculator is in a range of the error correction capacity of the decoder and for selecting an output signal of the first erasure calculator when the output signal of the second erasure calculator is not in a range of the error correction capacity of the decoder; an error location/size calculator for computing an error location equation by operating upon an output signal of the syndrome calculator and upon information received from the selector for computing an error size equation and for computing error location and size via the computed error location equation and error size equation; a second first-in, first-out memory for temporally storing an inputted flag bit and for inputting a selected result of the selector; a result output circuit for receiving the output signal of the first and second first-in, first-out memories and the error location/size calculator, for correcting errors in the data stored in the first first-in, first-out memory according to an output from the error location/size calculator, for outputting a flag indicating one of error-corrected data and normal data, and for outputting a flag indicating errors or possible errors according to the original data when the error correction was not processed.

To achieve the object of an error correction code decoding method, it includes the steps of a first step of judging whether total number of flags, which indicate one of errors or possible errors, in original data is in the range of the error correction capacity of the decoding method by counting the number of flags corresponding to the normal data and the number of flags of the error or possible error data; a second step corresponding to implementing the error correction by erasing all flags of error data and possible error data when the sum of the flags, which indicates one error or possible error, is in the range of error correction capacity of decoding method, and by erasing flags indicating normal data when the sum of the flags, is not in the range of the error correction; a third step of outputting flags which indicate that all data including corrected data are normal when all errors are corrected; and a fourth step of outputting flags, which indicate the error data, and the original data when erasures are recognized but associated therewith are errors not corrected, and outputting flags, which indicate possible errors, and the original data when each of the data is not recognized as erasures.

BRIEF DESCRIPTION OF THE DRAWINGS

The objects and features of the invention may be more readily understood with reference to the following detailed description of an illustrative embodiment of the invention, taken together with the accompanying drawings in which:

Figures 4A, 4B, 4C:
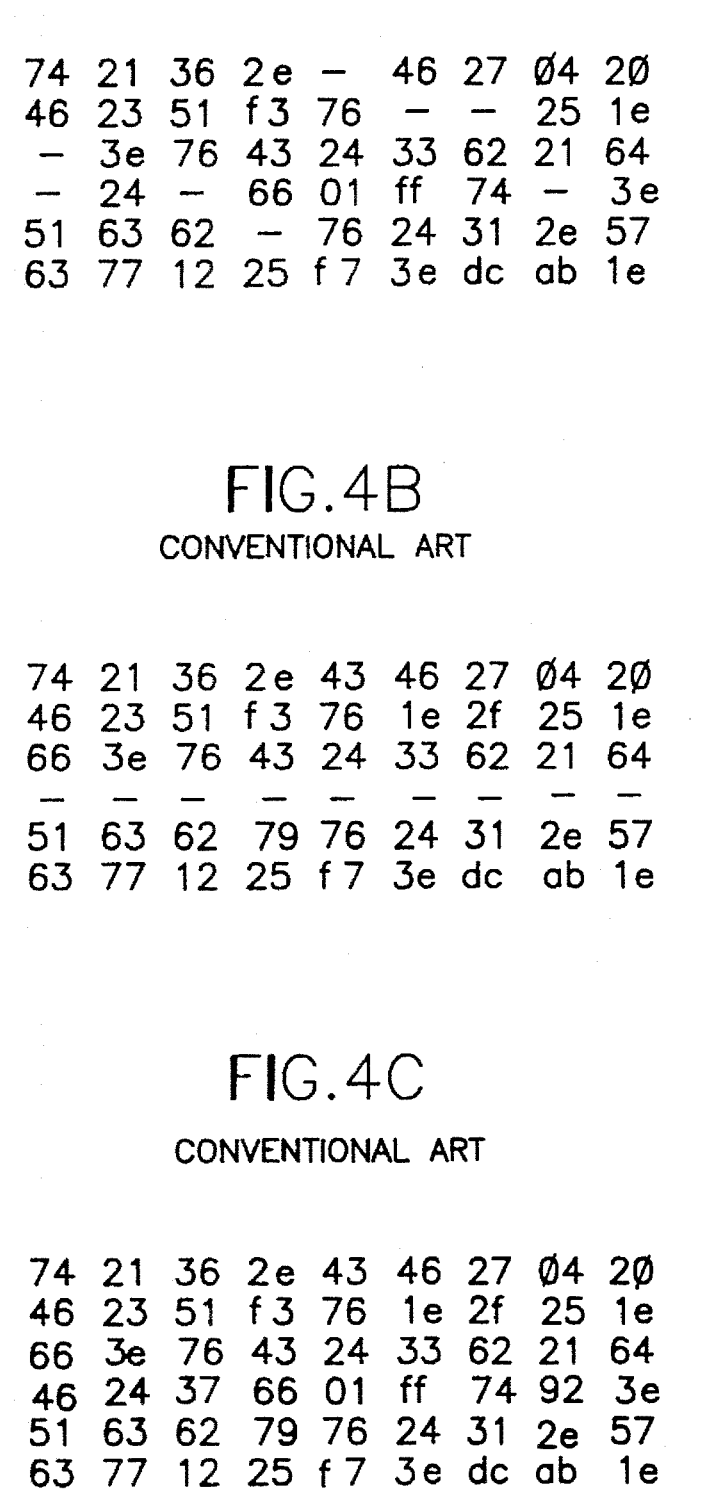

FIG. 4A, FIG. 4B and FIG. 4C are illustrative views showing a conventional error correction decoding;

FIG. 5 is a block diagram showing an error correction decoder according to the present invention;

FIG. 9A, FIG. 9B and FIG. 9C are illustrative views showing an error correction decoding according to the present invention.

DESCRIPTION OF THE PREFERRED EMBODIMENTS

Figure 1:
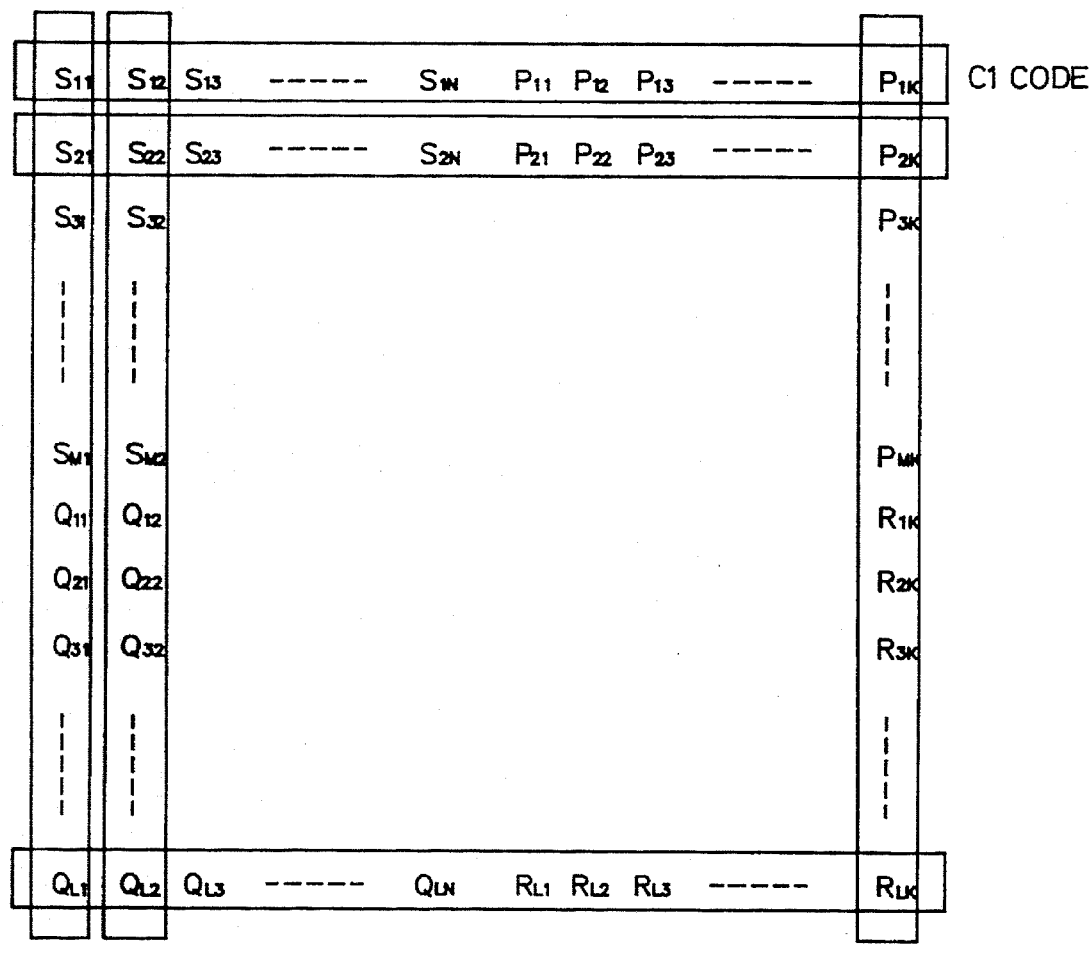
FIG. 1 is an illustrative view showing a product code.
Figure 2:
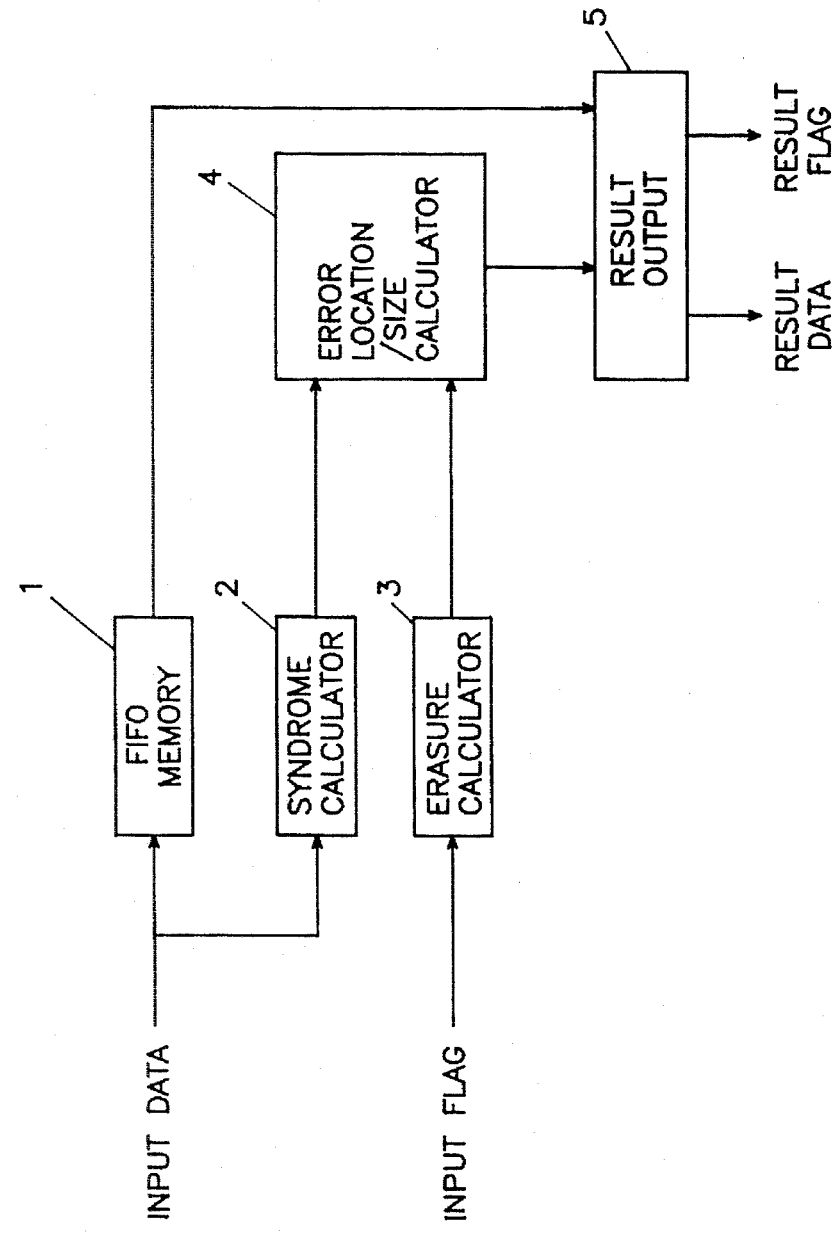
FIG. 2 is a block diagram showing a structure of a conventional decoder.
Figure 3:
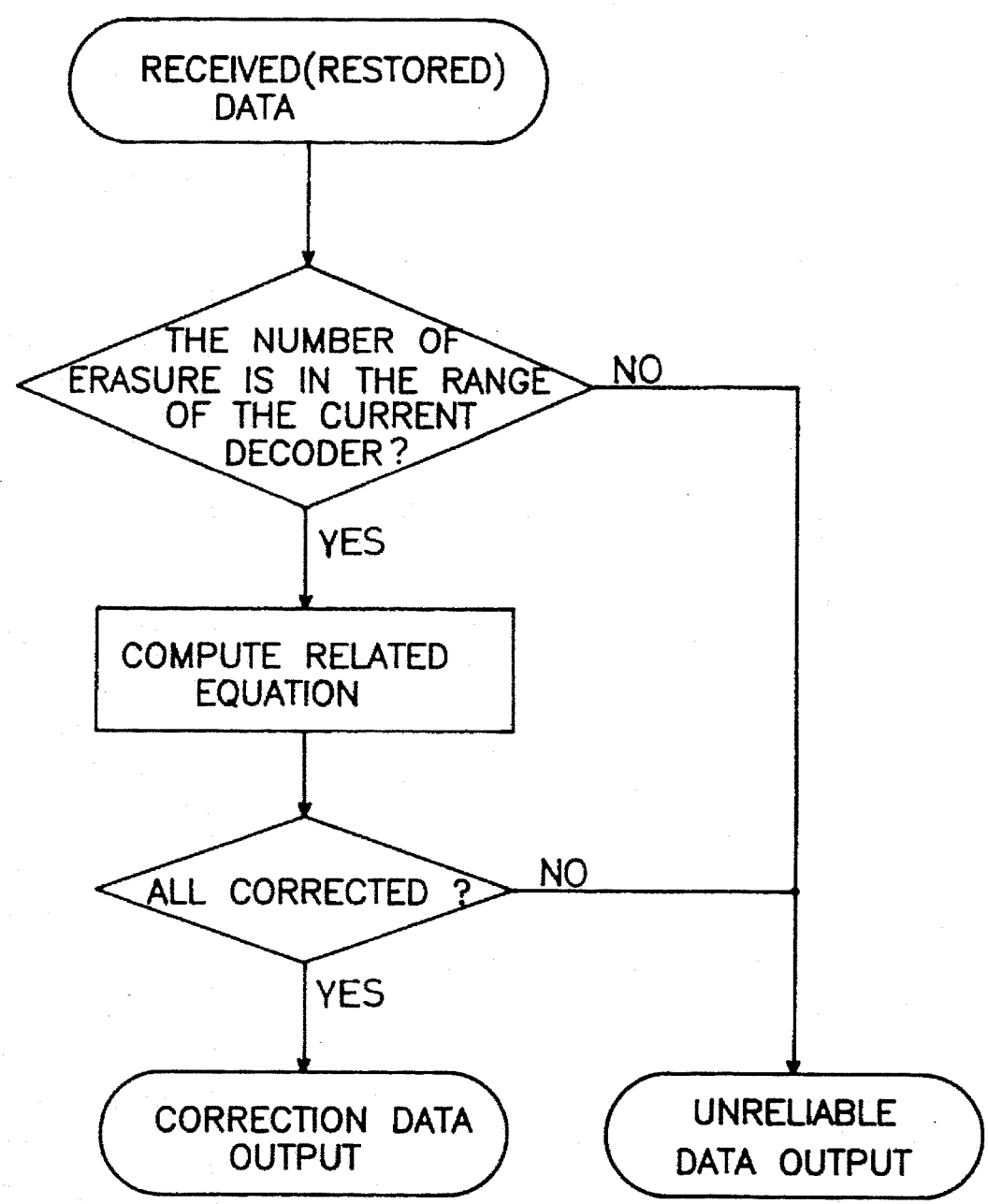
FIG. 3 is a flow chart showing an error correction process during decoding according to the conventional art.

Referring to FIG. 5, an error correction code decoder according to the present invention includes a first first-in, first-out memory 11 for temporally storing the received/restored data; a syndrome calculator 12 for computing a syndrome which is a specific error result value by operating the received/restored data; a first erasure calculator 13 for computing an erasure location equation by counting the number of "11" among the 2 bit flags; a second erasure calculator 14 for computing the erasure location equation by counting the total number of the "01" and "11" among 2 bit flags; a selector for selecting the output signal of the second erasure calculator 14 if the output signal of the second erasure calculator 14 is in the range of the error correction of the decoder by checking the output signal of the first and second erasure calculators 13 and 14 and for selecting the output signal of the first erasure calculator 13 if the output signal of the second erasure calculator 14 is in the range of the error correction of the decoder; an error location/size calculator 16 for computing the error location/size using the output signal of the syndrome calculator 12 and the output signal of the selector 15; a second first-in, first-out memory 17 for temporally storing the 2 bit flag; and a result output section 18 for outputting the corrected data and the flag set as "00" if the all the errors are corrected by the operation of the error location/size calculator 16, and for outputting the original data which are not corrected and the flags set as "01" and "11" according to the credibility of the original data when the errors are not corrected.

With references to the accompanying drawings, there will now be explained the detailed operation and effects of the error correction code decoder and a method thereof according to the present invention.

If the error occurrence rate of the data received/restored at the decoder according to the present invention increases, the data in which the flag is "11" are always recognized as errors, however, the data in which the flag is "01" are recognized as either errors or normal data according to the given cases, because the data in which the flag is "01" implies possible errors, and not always errors. The decision is made according to whether the equation related to the erasures recognizes these as errors that are in the range of the error correction of the decoder. If the equation related to the erasures recognizes these as errors as the errors which are in the range of the error correction of the decoder, when all the data in which the flags are "01" and "11" are recognized as errors.

Meanwhile, if the decoding was successful during outputting, the flag bits are set as "00," however, in case of not being decoded, the flags are set as "01" or "11" according to the credibility of the original data.

The flag setting methods according to the credibility of the original data will now be explained with references to the first embodiment to the third embodiment according to the present invention.

The first embodiment according to the present invention, as shown in FIG. 5 and FIG. 6 shows that the received/restored data are temporally stored into the first-in, first-out memory 11 and the syndrome calculator 12 computes syndromes which are the specific result values of errors. At this time, the first and second erasure calculators 13 and 14 in which the 2 bit flags are inputted thereinto count the number N1 in which the flags are "11," and counts the number N2 in which the flags are "01" and "11." The flags are temporally stored into the first-in, first-out memory 17. At this time, the first erasure calculator 13 counts only the number N1 in which the flags are "11," and computes the erasure location equation if the number N1 is in the range of the error correction of the decoder. In addition, the second erasure calculator 14 computes the erasure location equation if the number N2 is in the range of the error correction of the decoder by counting the data in which the flags are "01" and "11."

Thereafter, the selector 15 selects the output signal of the second erasure calculator 14 and outputs to the error location/size calculator 16 if the output signals of the second erasure calculator 14 are in the range of the error correction of the decoder. In addition, the selector 15 selects the output signal of the first erasure calculator 13 and outputs to the error location/size calculator 16 if the output signals of the second erasure calculator 14 are in the range of the error correction of the decoder. At this time, the error location/size calculator 16, according to the signals inputted from the syndrome calculator 12, computes the error location equation using the information received from the selector 15 and then computes the error size equation. The error location/size calculator 16 computes the error location/size using the error location equation and the error size equation and outputs to the result output section 18.

Therefore, the result output section 18 corrects the errors mixed into the data inputted from the first-in, first-out memory 11 according to the output signal of the error location/size calculator 16. If all the errors are corrected, the result output section 18 outputs the corrected data and the flags set as "00," implying all the data are normal. However, if the error correction is not implemented, the result output section 18 checks each of the data and judges whether the data are considered as erasures. In case that the data are recognized as erasures, the flags are set as "11," and the then data are recognized as errors. In case that the data are not recognized as erasures, the flags are set as "01," which implies that the data may be possible errors, in this case, the data are outputted without correction.

Figure 6A:
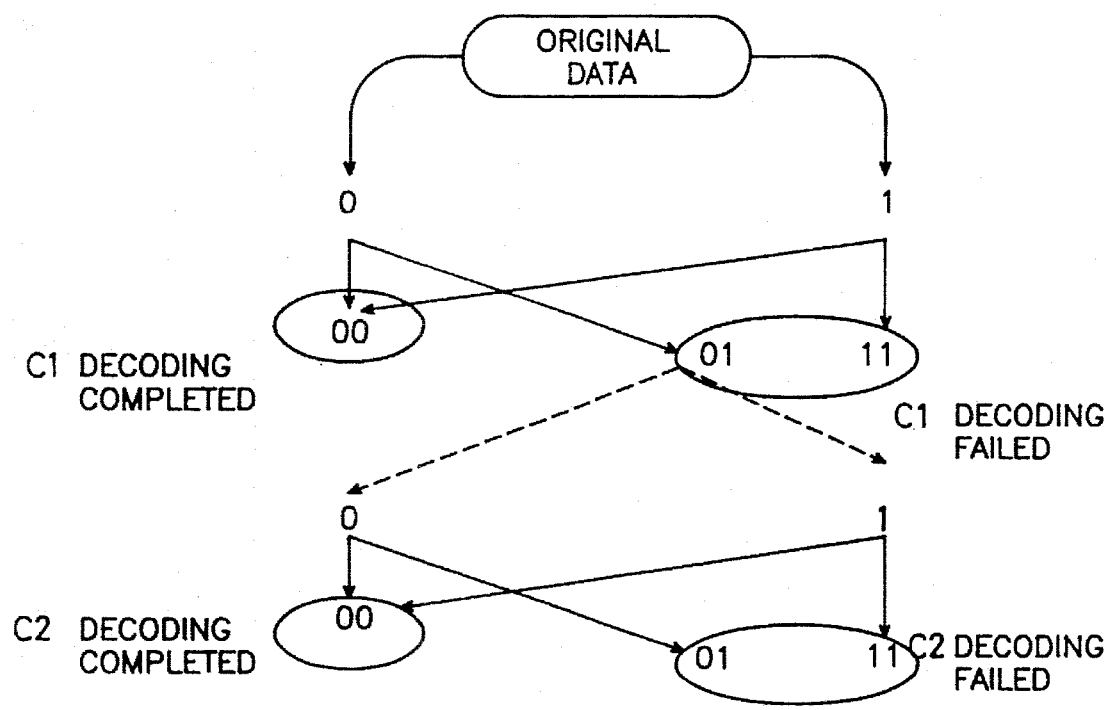
FIG. 6A and FIG. 6B are flow charts showing a process of an embodiment of the error correction decoder according to the present invention.
Figure 6B:
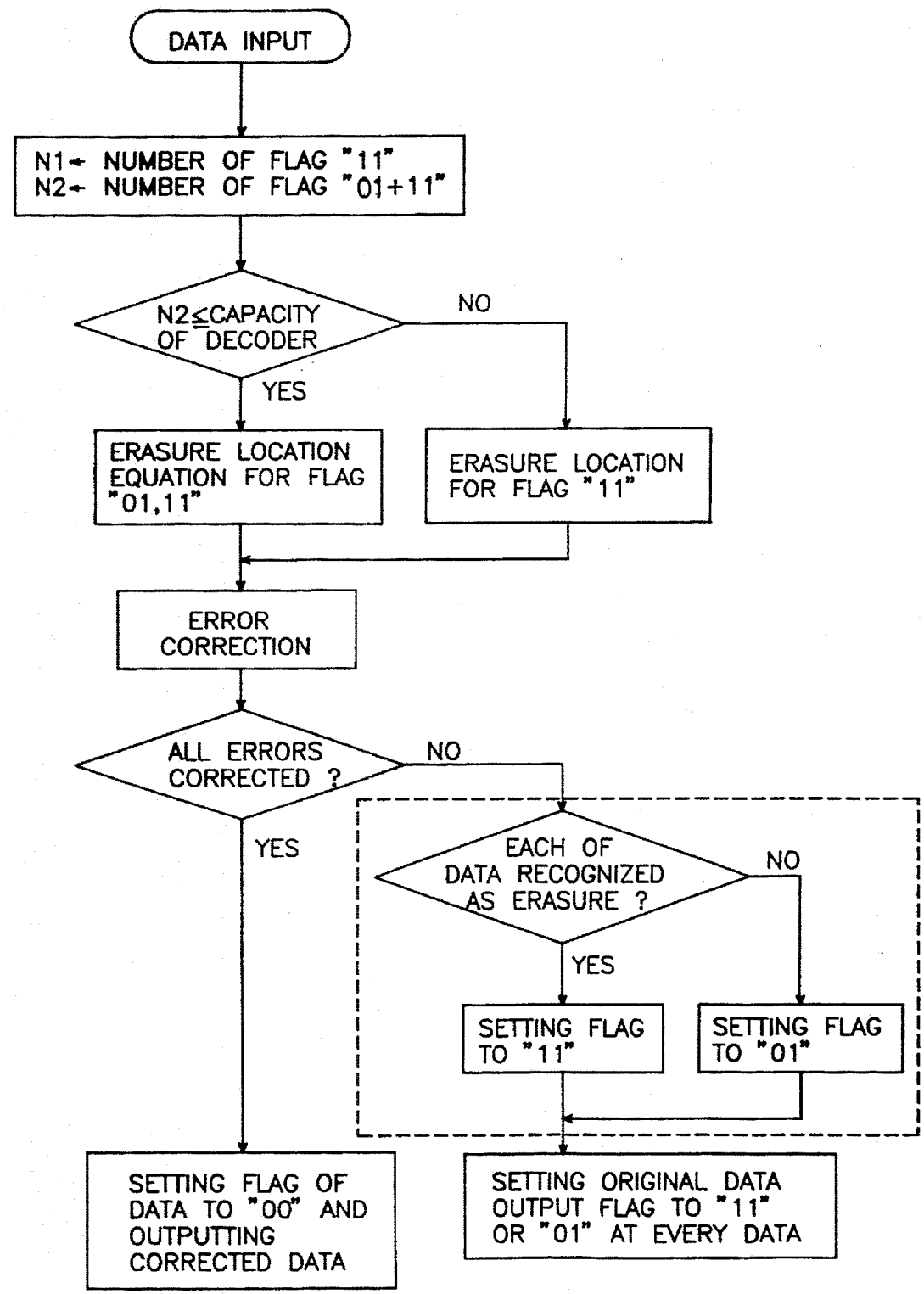

With reference to FIG. 6A, the operation will now be explained in detail.

In case that the receiving/restoring, the C1 decoding, and the C2 decoding of the data are implemented, the level of the data credibility are recommended to be classified in details like that of the present invention when the receiving/restoring apparatus of the data outputs the data, otherwise the existing receiving/restoring apparatus of the data are used, the existing flag of "0" and "1" should be implemented to output as "00" and "11." Therefore, the C1 decoder outputs "00" if the decoding is implemented during outputting. However, if decoding is not implemented, the flag will be outputted as "01" or "11" according to the level of the original data. That is, at the time when the decoding fails, the flags which are recognized as the original erasures are set as "11," however, the flags which are not recognized as the original erasures are set as "01," so, according to the cases, they are recognized as errors or normal data.

If the C2 decoder recognizes the data in which the flags are "01" and "11" as erasures, the C2 decoder recognizes the data in which the flags are "01" as an erasure if the number is in the range of the error correction of the decoder. However, if the data in which the flags are "01" and "11" are recognized as an erasure and if the number is not in the range of the error correction of the decoder, the C2 decoder recognizes the flags as "01" and "0" and implements decoding. If the C2 decoder completes the decoding of the data, the C2 decoder sets the flags of each of the data as "00." However, if the C2 decoder fails to decode and if the original data recognized as "0," the flags are set as "01," and in case that the original data are not recognized as "0," the flags are set as "11."

Figure 7A:
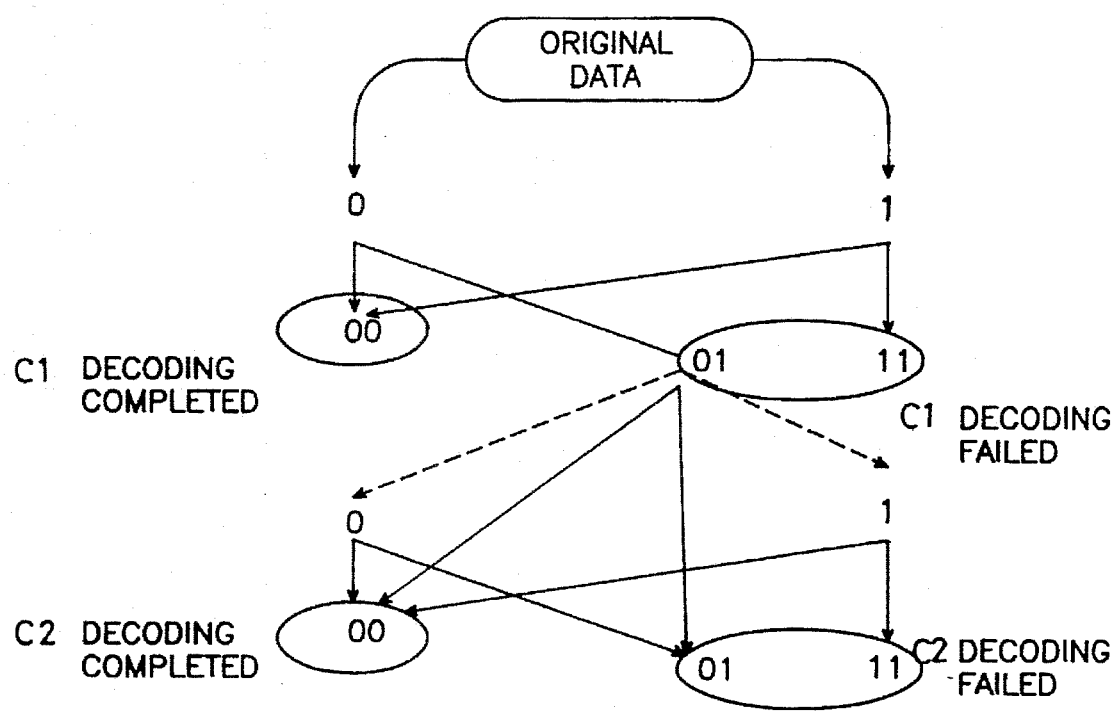
FIG. 7A and FIG. 7B are flow charts showing a process of another embodiment of the error correction decoder according to the present invention.
Figure 7B:
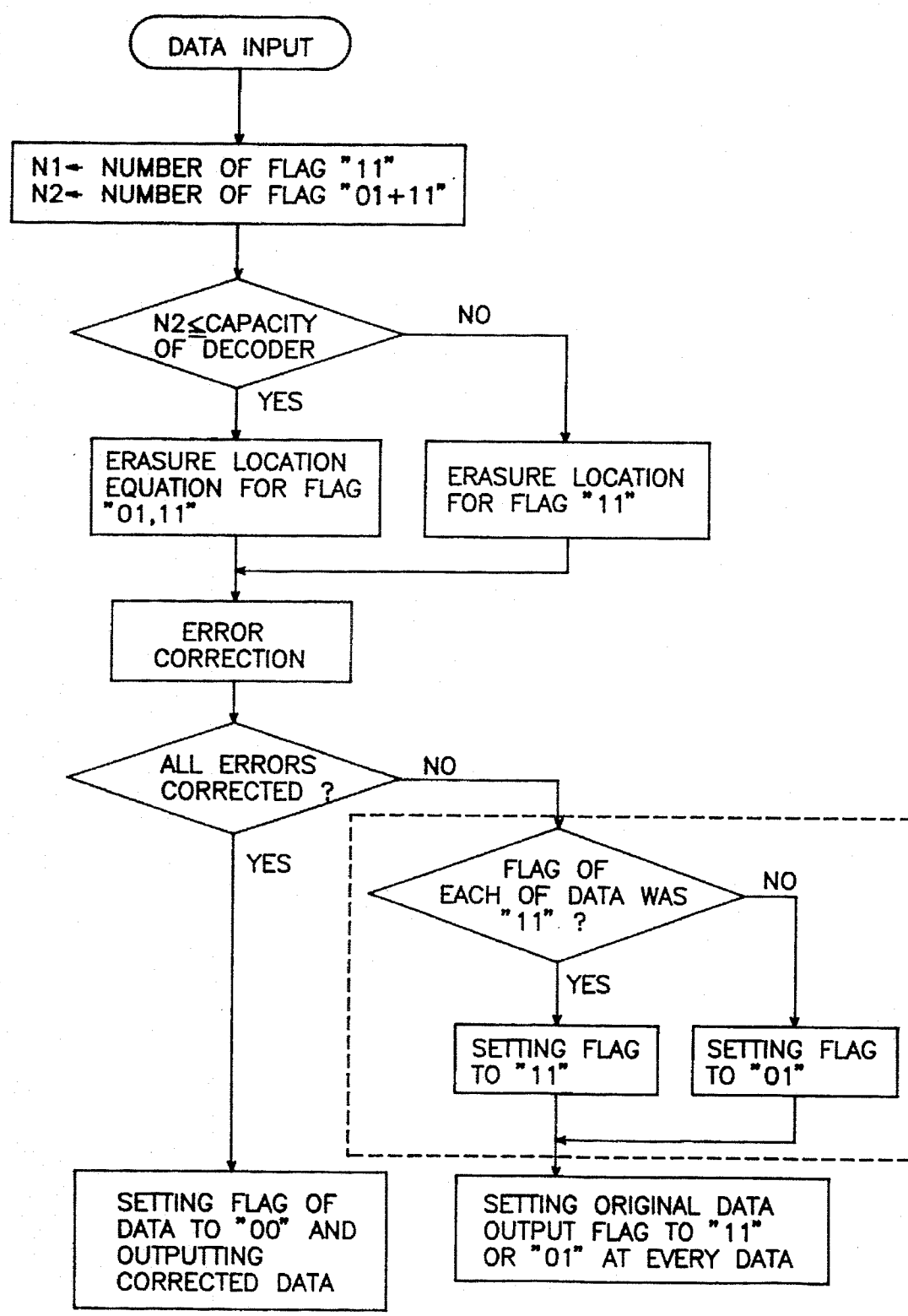

Meanwhile, the second embodiment according to the present invention, as shown in FIGS. 7A and 7B, will now be explained. Since the box enclosed with the dotted line is different to that of FIG. 6B, only the description related to the box will be explained. Through the same procedure as described at FIG. 6, whether the error corrections are to be implemented is recognized. If the error correction was not implemented, the flags of each of the data are recognized to have been "11." That is, if the flags of each of the data were "11," the output flags are set as "11," which implies that the data are errors. If the flags were not "11," the output flags are set as "01" which implies that the data may be possible errors. In this case, the data are outputted without corrections. During implementing of the C1 decoding, if the data in which the flags were "01" are decoded at the C2 decoder, the flags of the data set as "00," and if the decoding is not implemented, the flags of the data are set as "01," respectively.

Figure 8A:
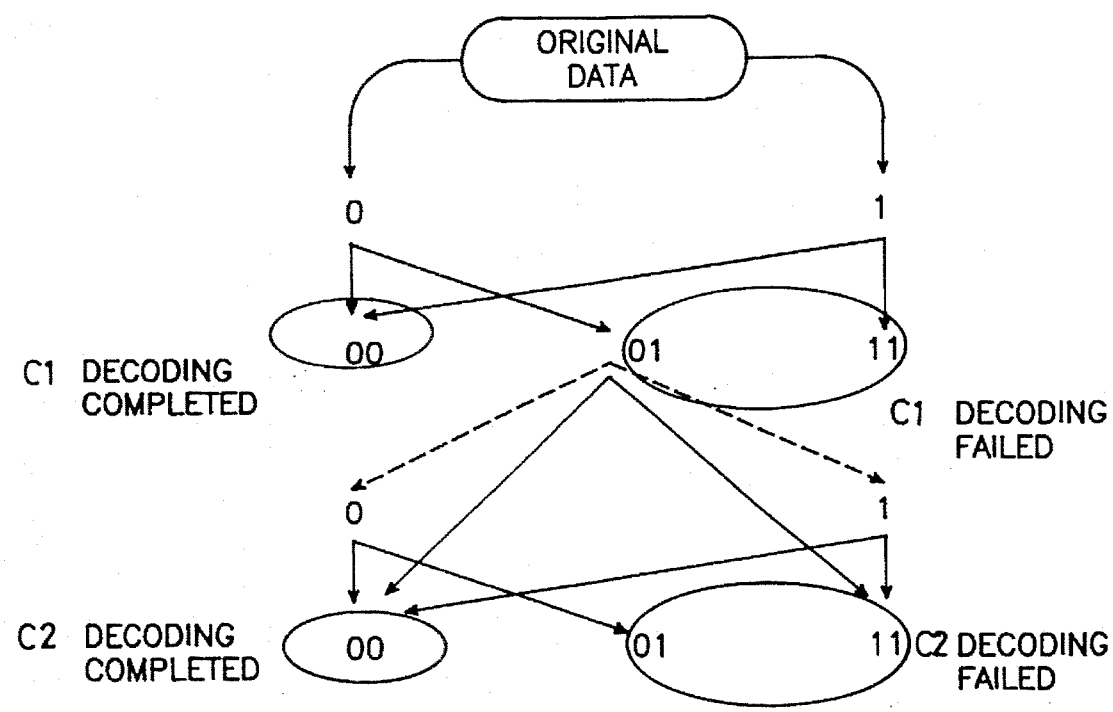
FIG. 8A and FIG. 8B are flow charts showing a process of still another embodiment of the error correction decoder according to the present invention.
Figure 8B:
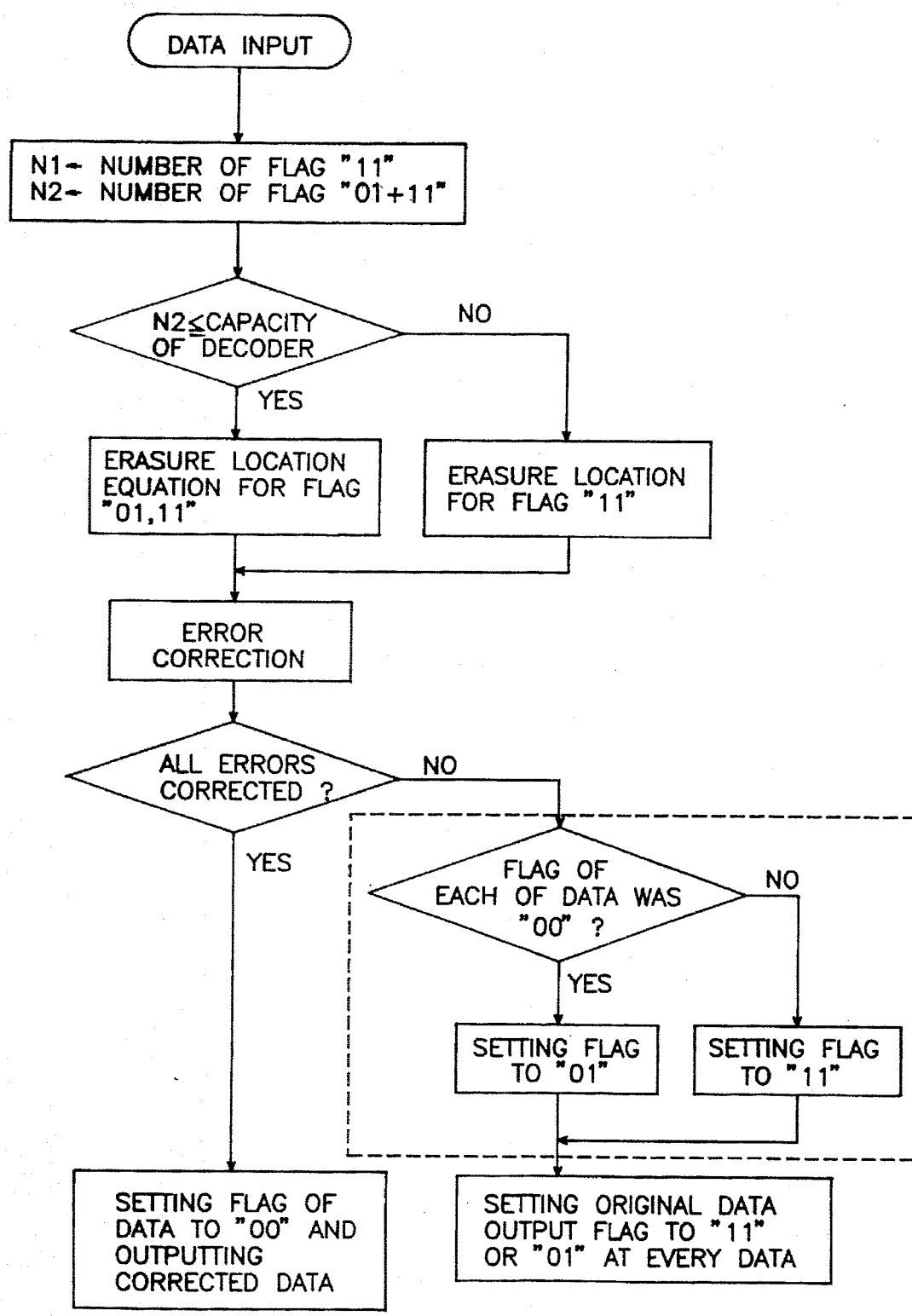

In addition, the third embodiment according to the present invention, as shown in FIGS. 8A and 8B, will now be explained. To begin with, if the error correction procedure was not implemented, the flags in which each of the data were "00" are judged. If the original flags were "00," the output flags are set as "01" which implies that the data may be possible errors. If the original flags were not "00," the output flags are set as "11" which implies that the data are errors. In this case, the data are outputted without correction. During implementing of the C1 decoding, if the data in which the flags were "01" are decoded at the C2 decoder, the flags of the data set as "00," and if the decoding is not implemented, the flags of the data are set as "11," respectively.

The fourth embodiment according to the present invention, as shown in FIG. 9, will now be explained.

Figures 9A, 9B, 9C:
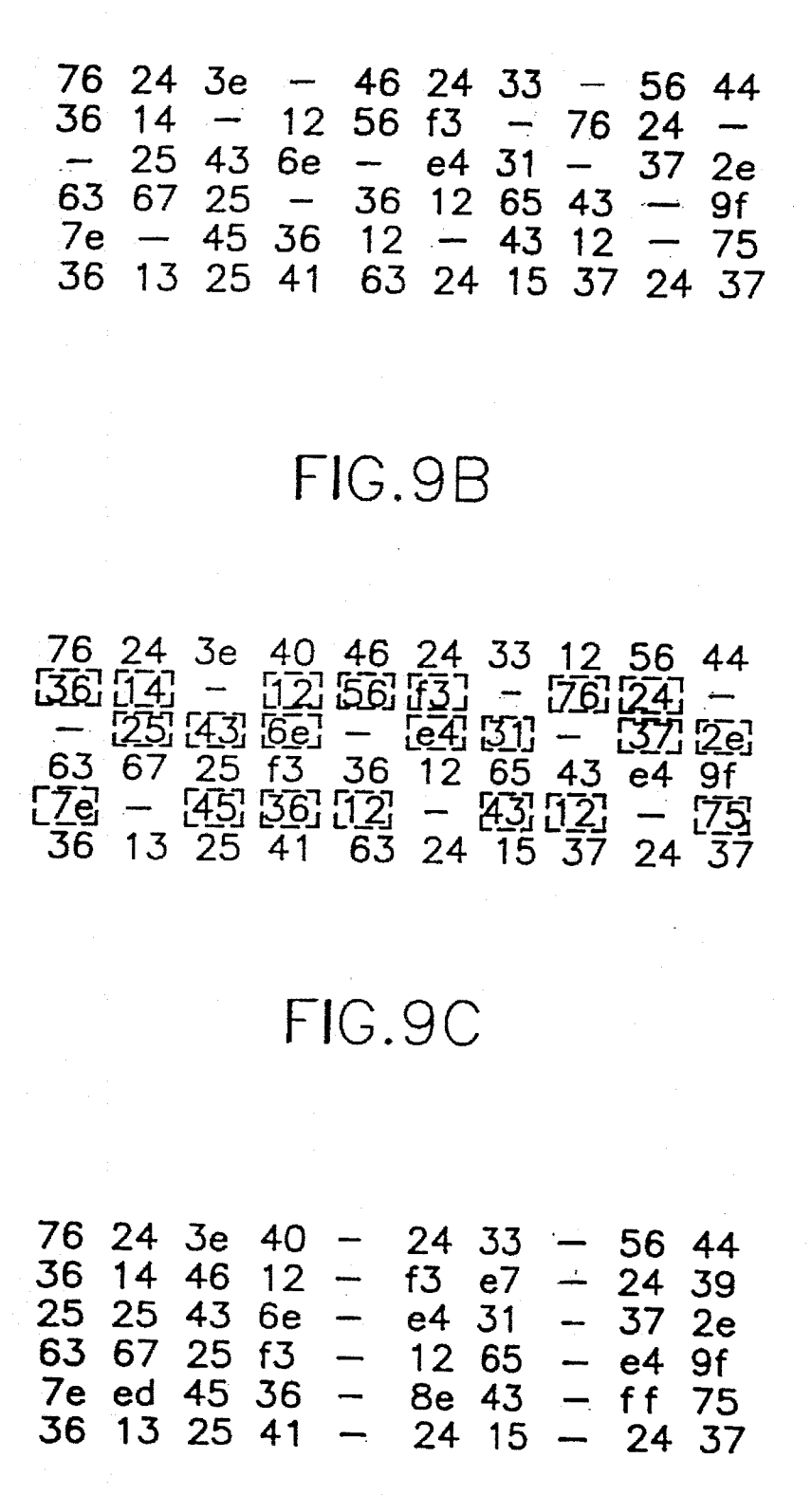

If assuming that two erasures of the C1 and C2 code or one error will be corrected, if the data received/restored are C1 decoded as shown FIG. 9A, the data shown in FIG. 9B will be obtained, here the second, third, and fifth rows are outputted without correction during decoding. The box enclosed with the dotted line implies that the flags of the data in the box are set as "01." If the data shown in FIG. 9B are C2 decoded, the data shown in FIG. 9C are obtained. In addition, the fifth and the eighth columns shown in FIG. 9 assumed that the errors exists in the flag of "01." In this case the decoder will not be implemented. As the error occurrence rate increases as shown in FIG. 9B, if the three rows all become erasures, in each of rows, there exists three erasures for the conventional decoder, so that all the data are set as erasures, however, the decoder according to the present invention, as shown in FIG. 9C, recognizes the flags set as "01" normal data and decodes the data.

The error correction code decoder and a method thereof according to the present invention have effects of effectively decoding by recognizing error data and possible error data and correcting the errors wherein the error correction code decoder uses the erasure.

What is claimed is:

1. An error correction code decoding method, comprising the steps of:
    a first step of judging whether a total number of flags, which indicate one of errors or possible errors in original data, is in a range of the error correction capacity of the decoding method by counting the number of flags indicating normal data and the number of flags corresponding to error or possible error data;
    a second step of implementing the error correction by erasing all flags corresponding to error data and possible error data when a sum of the flags, which indicate one of error or possible error, is in the range of the error correction capacity of the decoding method, and by erasing flags indicating normal data when the sum of the flags is not in the range;
    a third step of outputting flags which indicate that all data including corrected data are normal when all errors are corrected; and
    a fourth step of outputting flags, which indicate the error data, and the original data when erasures are recognized but errors associated therewith are not corrected, and outputting flags, which indicate possible errors, and the original data when each of the data is not recognized as erasures.

2. The method of the claim 1, wherein said fourth step outputs flags which indicate possible errors in the original data when original flags are normal data, by judging whether the original flags are normal data when errors were not corrected; and flags which indicate errors in the original data when original flags of each of data are not normal data.

3. The method of the claim 1, wherein said fourth step outputs flags which indicate errors in the original data by judging whether original flags of each of the data are errors when errors were not corrected; and flags which indicate possible errors when original flags of each of the data are not flags of error data.

4. An error correction decoder, comprising:
    a first memory for storing received/restored original data;
    a syndrome calculator for computing a syndrome value via an operation upon the received/restored original data;
    a first erasure calculator for computing an erasure location equation and for counting the number of flags which indicates normal data;
    a second erasure calculator for computing an erasure location equation and for counting the number of flags which indicate error data or possible error data;.
    a selector for selecting an output signal of the second erasure calculator when an output signal of the second erasure calculator is in a range of the error correction capacity of the decoder and for selecting an output signal of the first erasure calculator when the output signal of the second erasure calculator is not in the range of the error correction capacity of the decoder;
    an error location/size calculator for computing an error location equation by operating upon an output signal of the syndrome calculator and upon information received from the selector, for computing an error size equation, and for computing error location and size via the computed error location equation and error size equation; and
    result output means, responsive to an output signal of the first memory and the error location/size calculator, for correcting errors in the data stored in the first memory according to an output from the error location/size calculator, for outputting a flag indicating one of error-corrected data and normal data, and for outputting a flag indicating errors or possible errors according to the original data when error correction was not processed.

5. A decoder as in claim 1, wherein:

the memory is a first-in, first-out memory.

6. A decoder as in claim 1, further comprising:

a second memory for storing the flags corresponding to data operated upon by the first and second erasure calculators, and for receiving information from the selector, the result output means being responsive to the second memory.

* * * * *